(12) United States Patent
Son et al.

(10) Patent No.: US 12,500,096 B2
(45) Date of Patent: Dec. 16, 2025

(54) APPARATUS FOR INSPECTING DROPLET AND SUBSTRATE PROCESSING APPARATUS INCLUDING THE SAME

(71) Applicant: SEMES CO., LTD., Chungcheongnam-do (KR)

(72) Inventors: Young Jun Son, Chungcheongnam-do (KR); Young Un Yun, Chungcheongnam-do (KR); Sung Chul Jung, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 434 days.

(21) Appl. No.: 17/989,690

(22) Filed: Nov. 18, 2022

(65) Prior Publication Data

US 2023/0178389 A1 Jun. 8, 2023

(30) Foreign Application Priority Data

Dec. 2, 2021 (KR) .......................... 10-2021-0171089

(51) Int. Cl.
*H01L 21/67* (2006.01)
*H01L 21/66* (2006.01)
(Continued)

(52) U.S. Cl.
CPC ........ *H01L 21/67051* (2013.01); *H01L 22/14* (2013.01); *G01N 2015/0011* (2013.01); *G01N 2015/0053* (2013.01); *G01N 15/1031* (2013.01)

(58) Field of Classification Search
CPC ....... G01N 15/1031; G01N 2015/0053; G01N 2015/0011; H01L 22/14; H01L 21/67051
See application file for complete search history.

(56) References Cited

U.S. PATENT DOCUMENTS 3,864,044 A * 2/1975 Lyshkow ............. G01N 21/255
250/573
6,425,497 B1 * 7/2002 Chu ........................ G03F 7/162
222/64
(Continued)

FOREIGN PATENT DOCUMENTS

CN 215180951 U * 12/2021
JP 2009175074 A * 8/2009
(Continued)

OTHER PUBLICATIONS

Machine translation of JP-2009175074-A to Akimoto, Aug. 2009. (Year: 2009).*
(Continued)

*Primary Examiner* — Benjamin L Osterhout
(74) *Attorney, Agent, or Firm* — WOMBLE BOND DICKINSON (US) LLP

(57) ABSTRACT

An apparatus for inspecting a chemical solution of the present invention comprises a base unit having an inlet, through which a chemical solution is introduced, a flow path unit, in which the chemical solution introduced through the inlet is moved while a velocity of its fluid is changed, and including a first region unit provided adjacent to the inlet of the base unit and a second region unit being in series communication with the first region unit, in which the chemical solution discharged from the first region unit is moved, a detecting unit including a first detecting member for detecting a first signal that is an electrical signal of the first region unit, and a second detecting member for detecting a second signal that is an electrical signal of the second region unit, and a determining unit for receiving a signal from the detecting unit and determining that a particle and a bubble are detected if a current of the first signal and the second signal is changed compared to a reference value, and discriminating and determining a particle and a bubble (Continued)

according to a difference in a current between the first signal and the second signal or a time difference, in which a current is changed.

20 Claims, 12 Drawing Sheets

(51) Int. Cl.
  *G01N 15/00* (2006.01)
  *G01N 15/1031* (2024.01)

(56) References Cited

U.S. PATENT DOCUMENTS

| | | | |
|---|---|---|---|
| 8,522,832 B2* | 9/2013 | Lopez | A61J 1/2058 |
| | | | 604/416 |
| 9,883,987 B2* | 2/2018 | Lopez | A61J 1/2089 |
| 10,352,866 B1* | 7/2019 | Arbatli | A61M 1/3626 |
| 10,371,620 B2 | 8/2019 | Knollenberg et al. | |
| 10,859,487 B2 | 12/2020 | Knollenberg et al. | |
| 11,020,541 B2* | 6/2021 | Fangrow | A61M 5/16813 |
| 11,590,057 B2* | 2/2023 | Tagliamento | A61J 1/2062 |
| 2004/0238005 A1* | 12/2004 | Takayama | H01L 21/67057 |
| | | | 134/2 |
| 2008/0150518 A1* | 6/2008 | Becker | G01N 15/1031 |
| | | | 73/53.07 |
| 2019/0277745 A1* | 9/2019 | Matsuda | G01N 15/1434 |
| 2022/0405902 A1* | 12/2022 | Estrella | G06T 7/50 |

FOREIGN PATENT DOCUMENTS

| | | |
|---|---|---|
| JP | 2010-281701 | 12/2010 |
| JP | 2012-204813 | 10/2012 |
| JP | 2019-521326 | 7/2019 |
| KR | 1998-0065910 | 10/1998 |
| KR | 1999-0072013 | 9/1999 |
| KR | 10-2019-0108571 | 9/2019 |
| KR | 10-2019-0139014 | 12/2019 |
| KR | 10-2020-0133892 | 12/2020 |

OTHER PUBLICATIONS

Machine translation of CN-215180951-U to Dugas, Dec. 2021. (Year: 2021).*

Notice of Allowance dated Dec. 4, 2023 for Korean Patent Application No. 10-2021-0171089 and its English translation by Google Translate.

* cited by examiner

[FIG. 1]
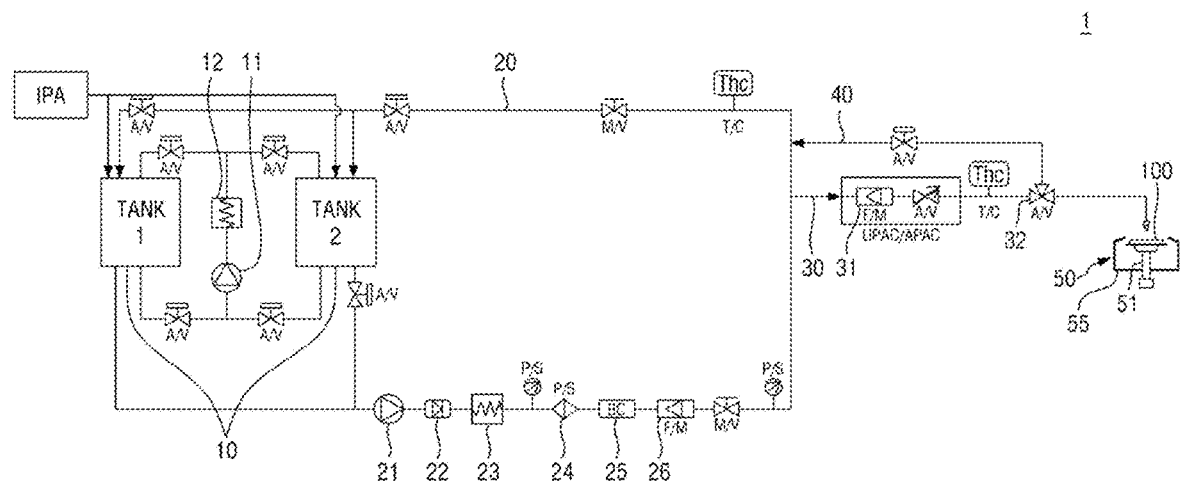
[FIG. 2]
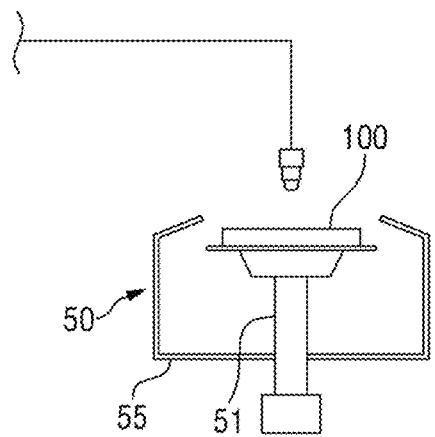

[FIG. 3]
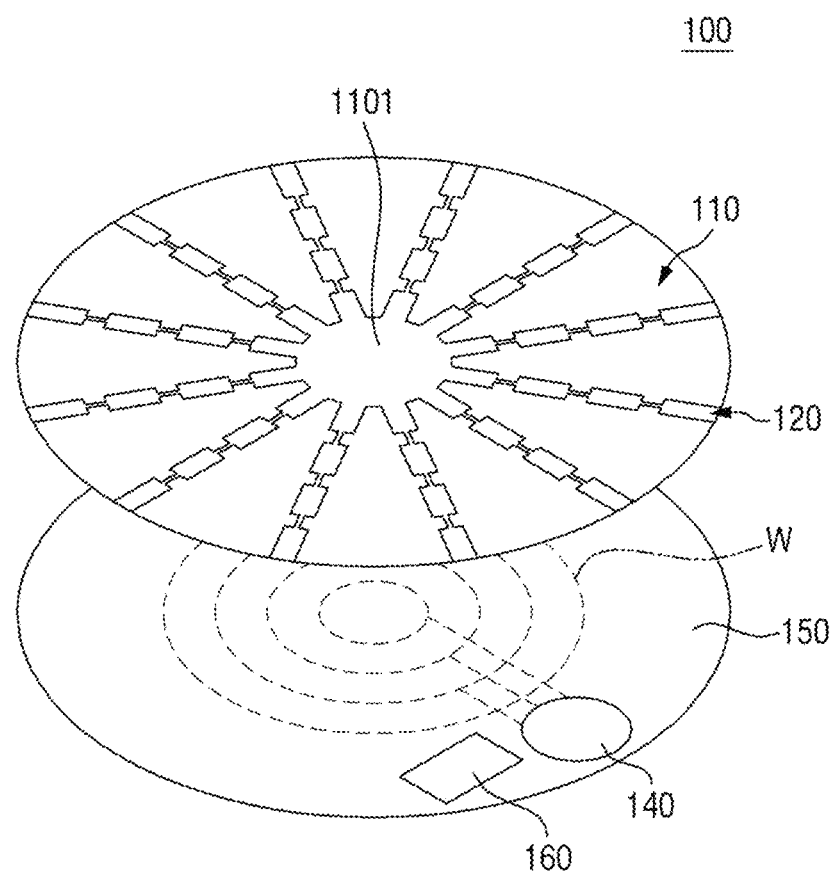

[FIG. 4]
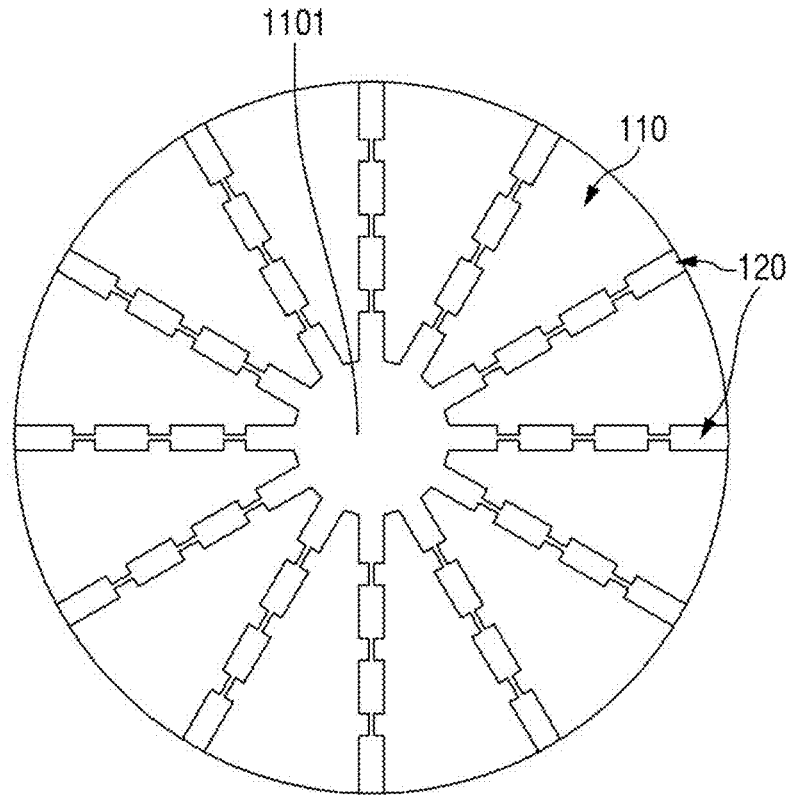
[FIG. 5]
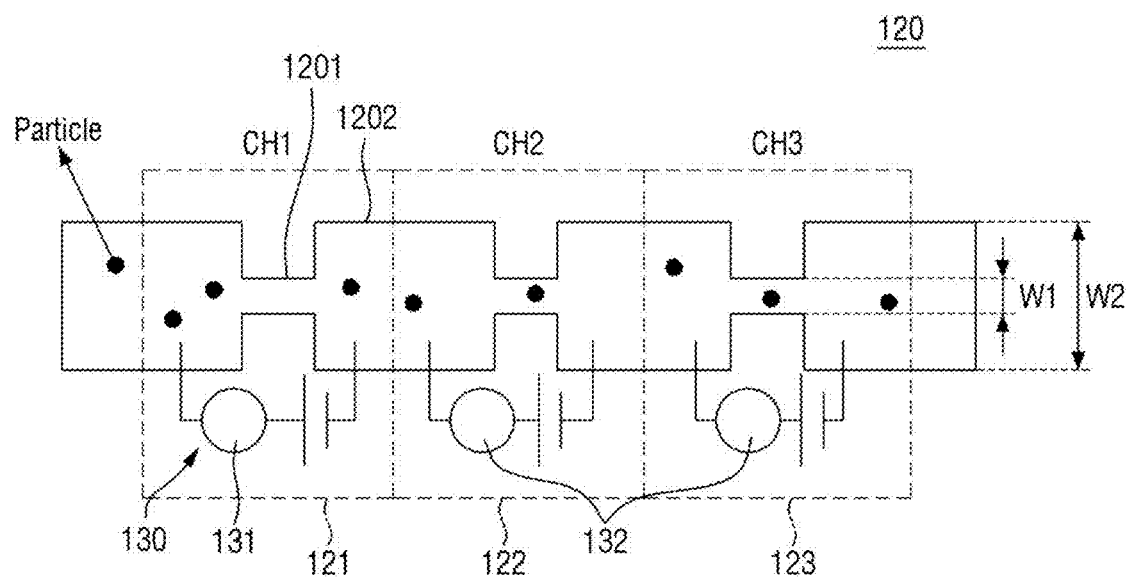

[FIG. 6]
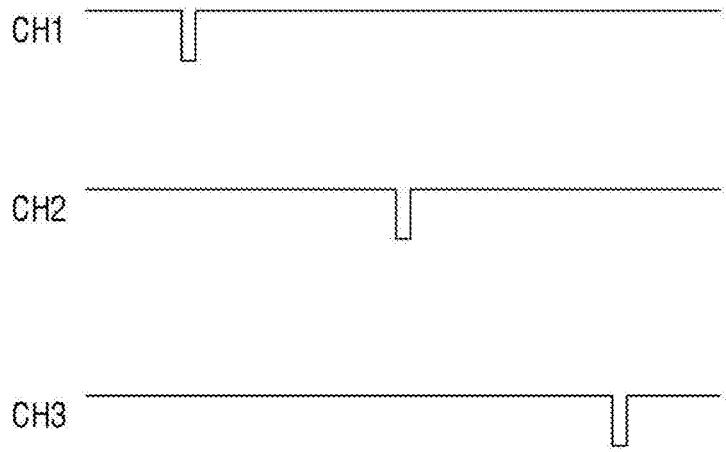
[FIG. 7]
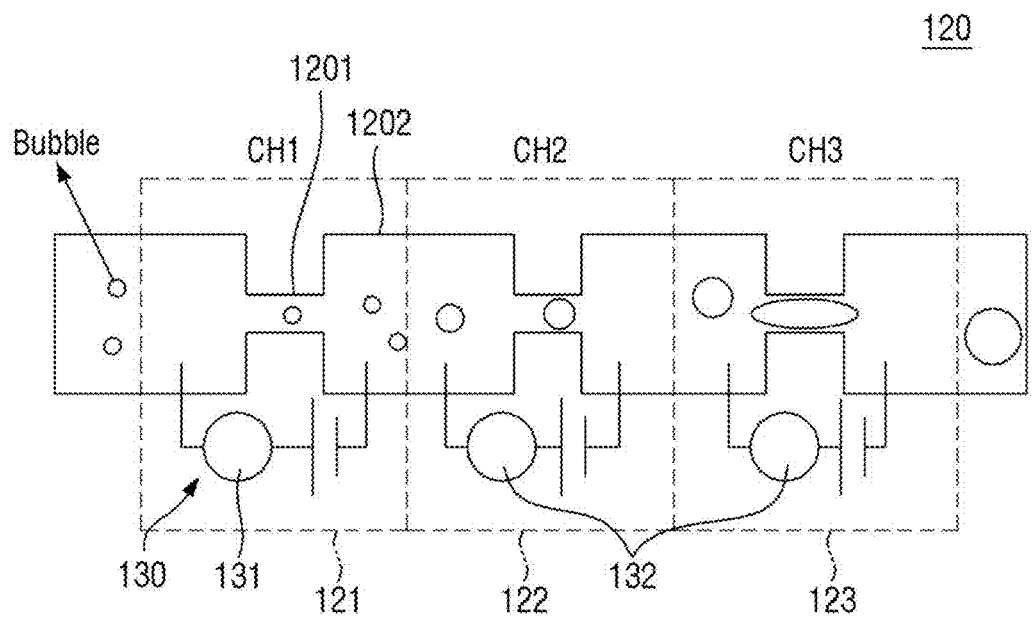

[FIG. 8]
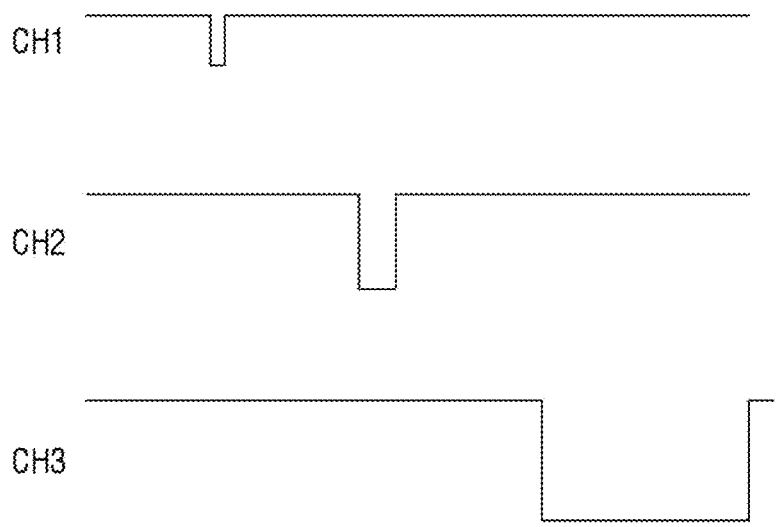
[FIG. 9a]
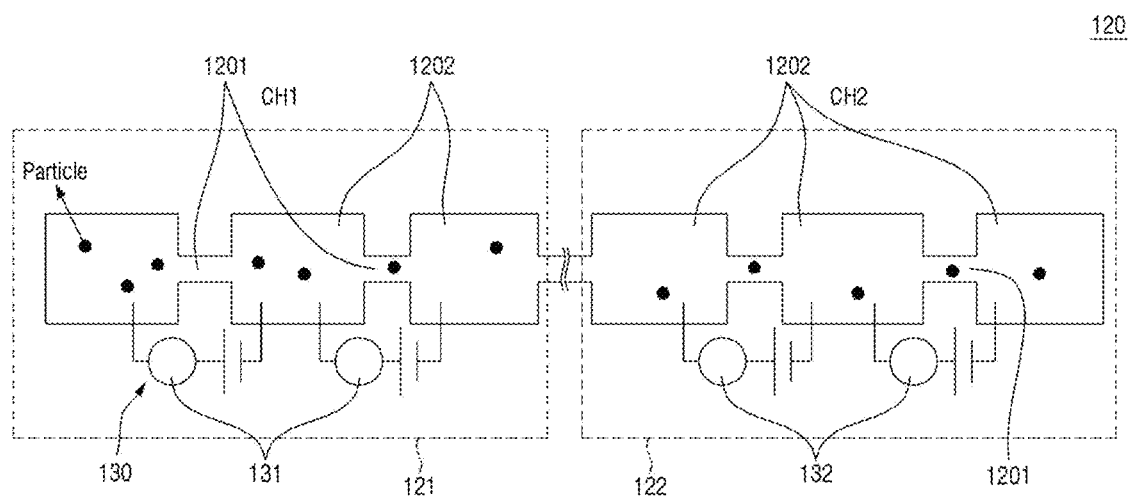

[FIG. 9b]
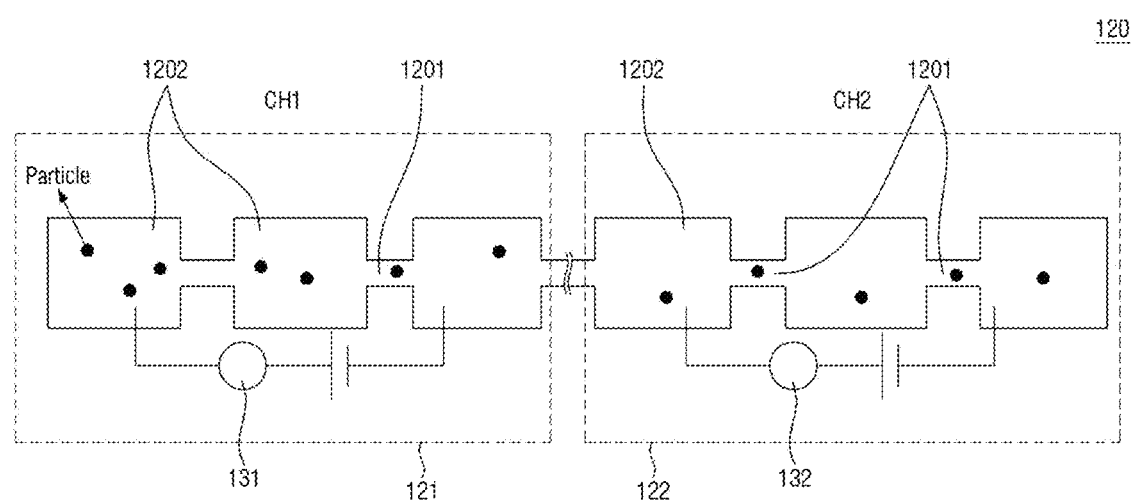
[FIG. 10]
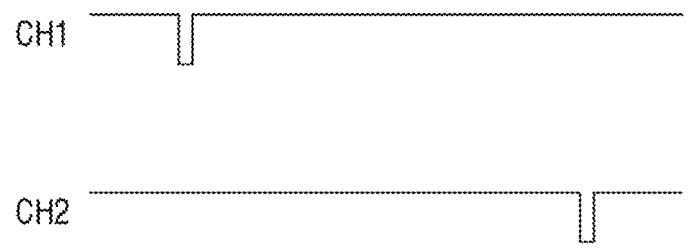

[FIG. 11]
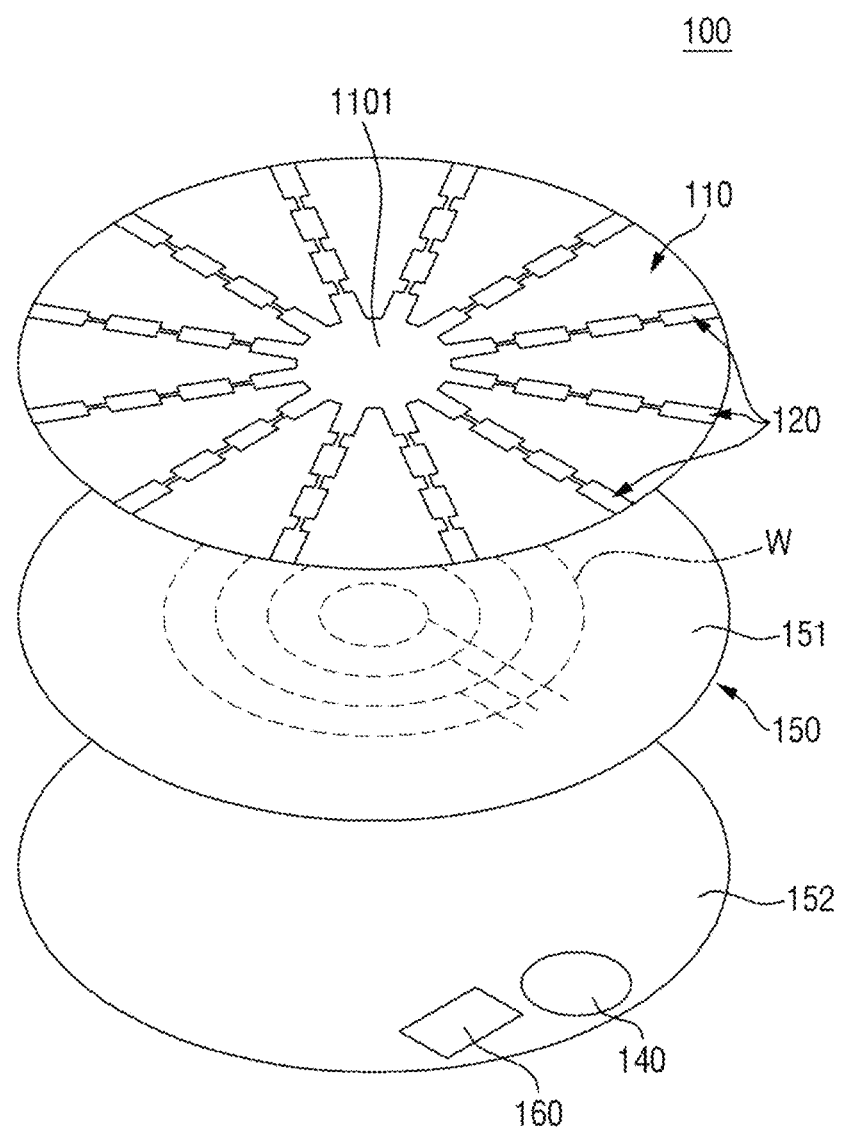

[FIG. 12]
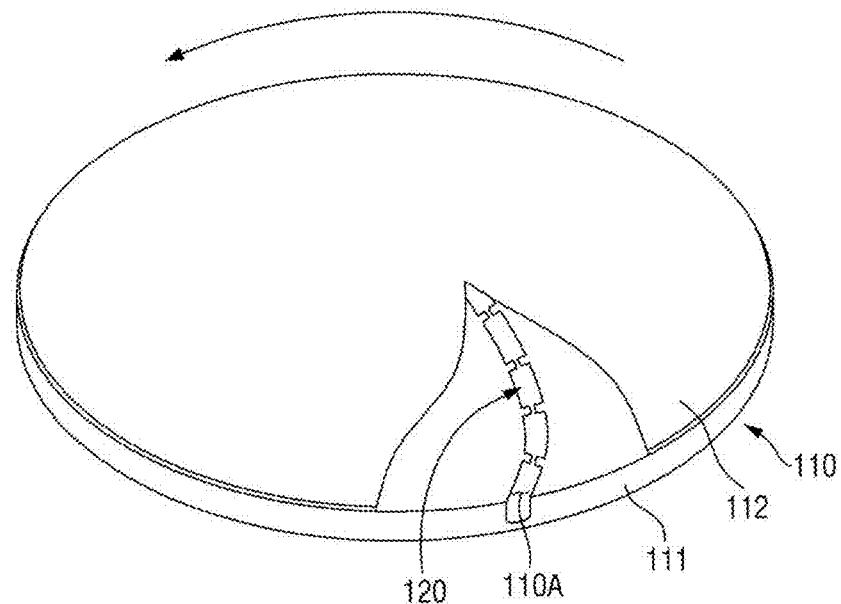
[FIG. 13]
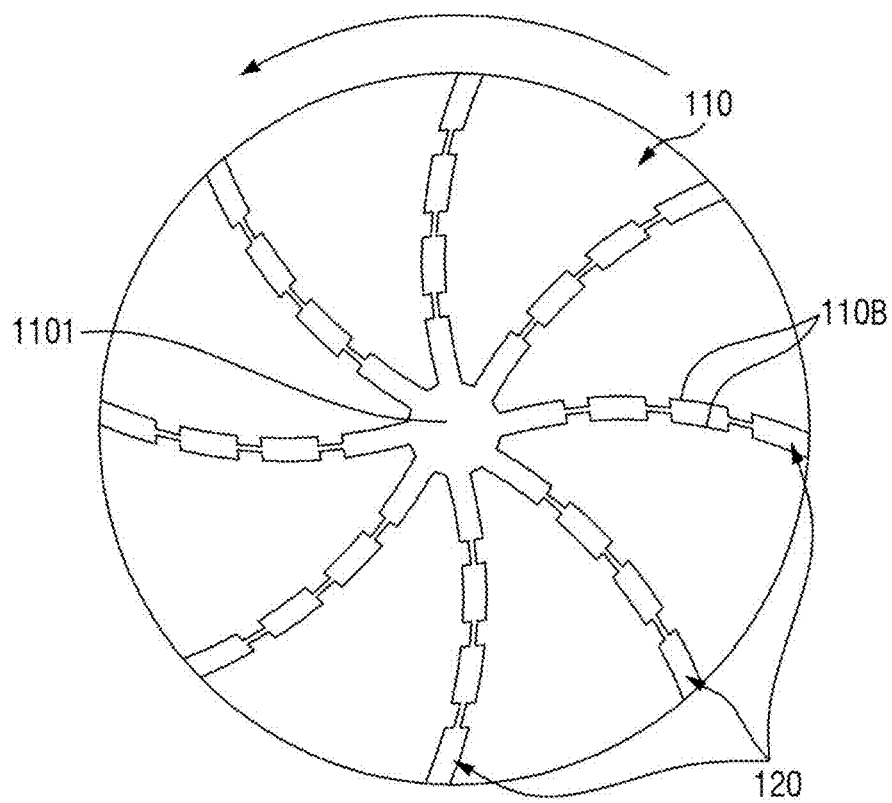

[FIG. 14]
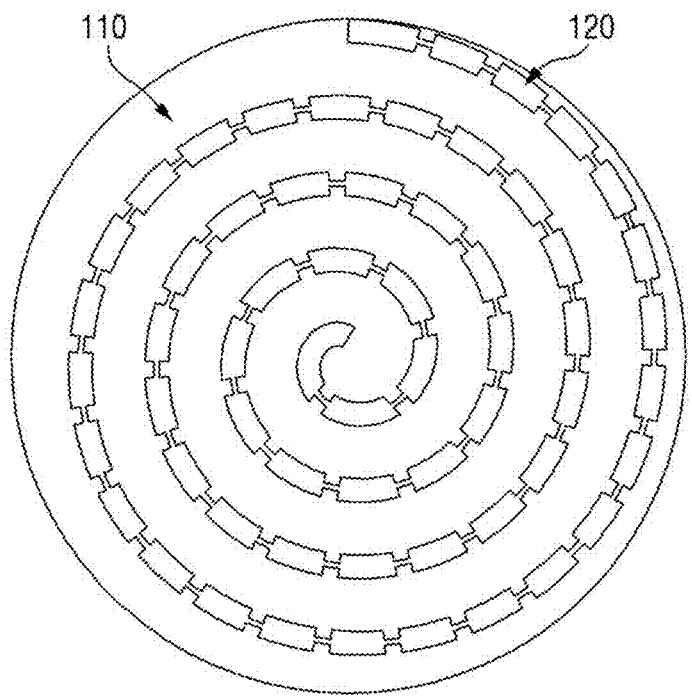
[FIG. 15]
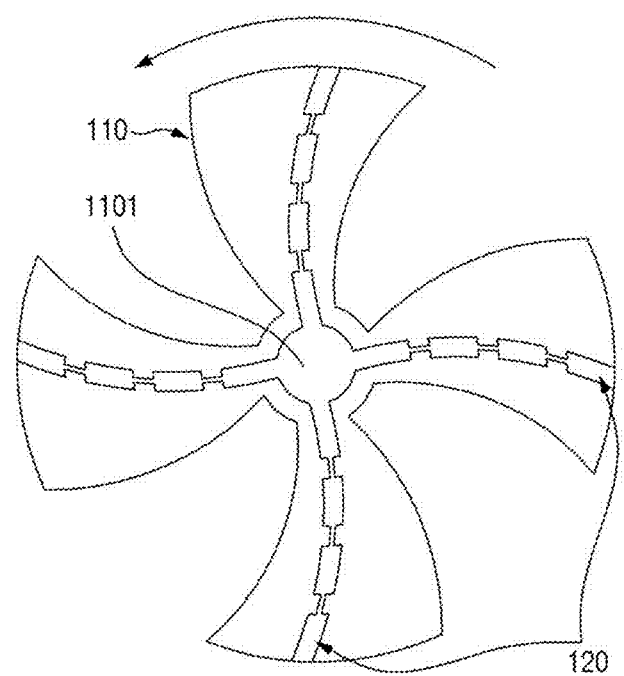

[FIG. 16]
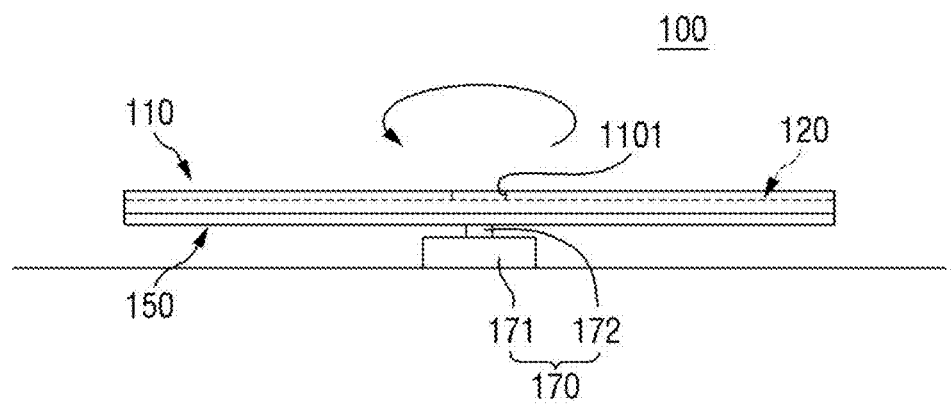
[FIG. 17]
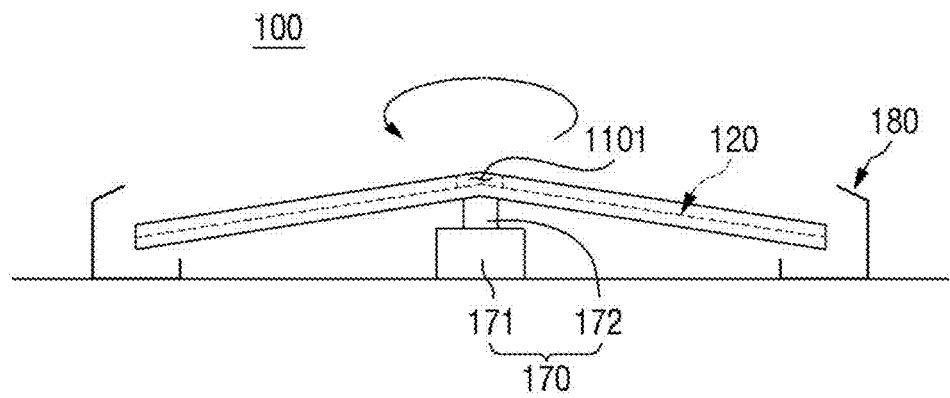

[FIG. 18]
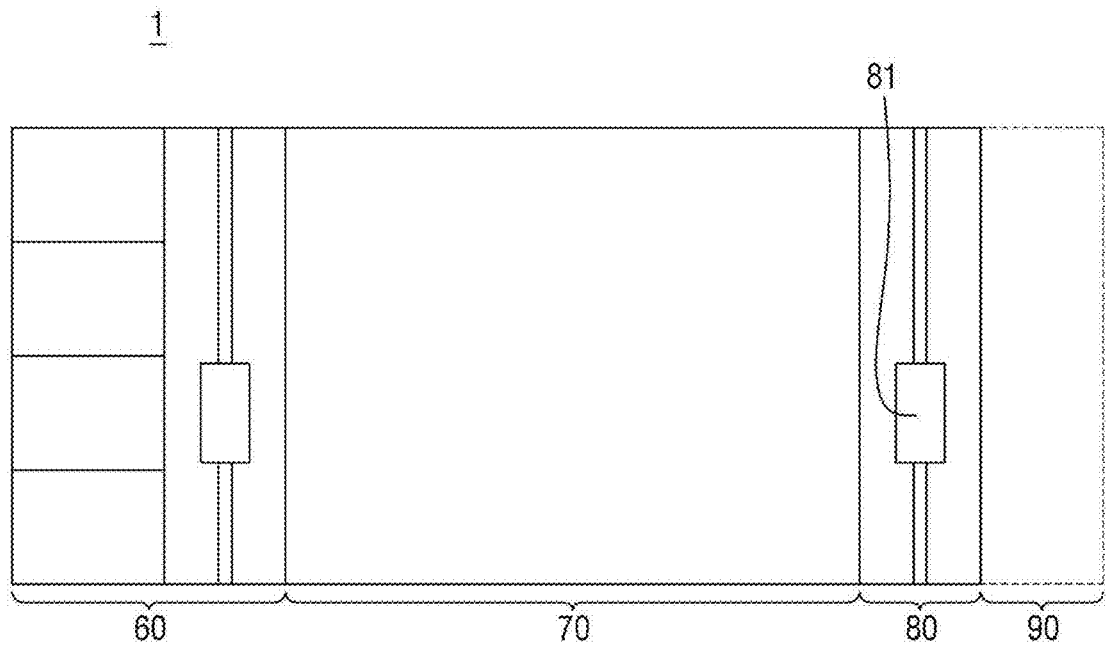
[FIG. 19]
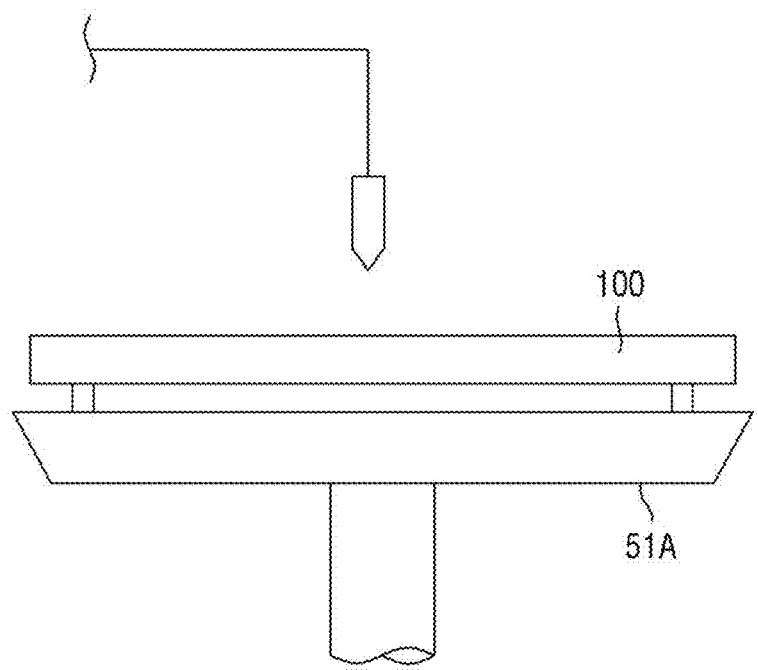

[FIG. 20]
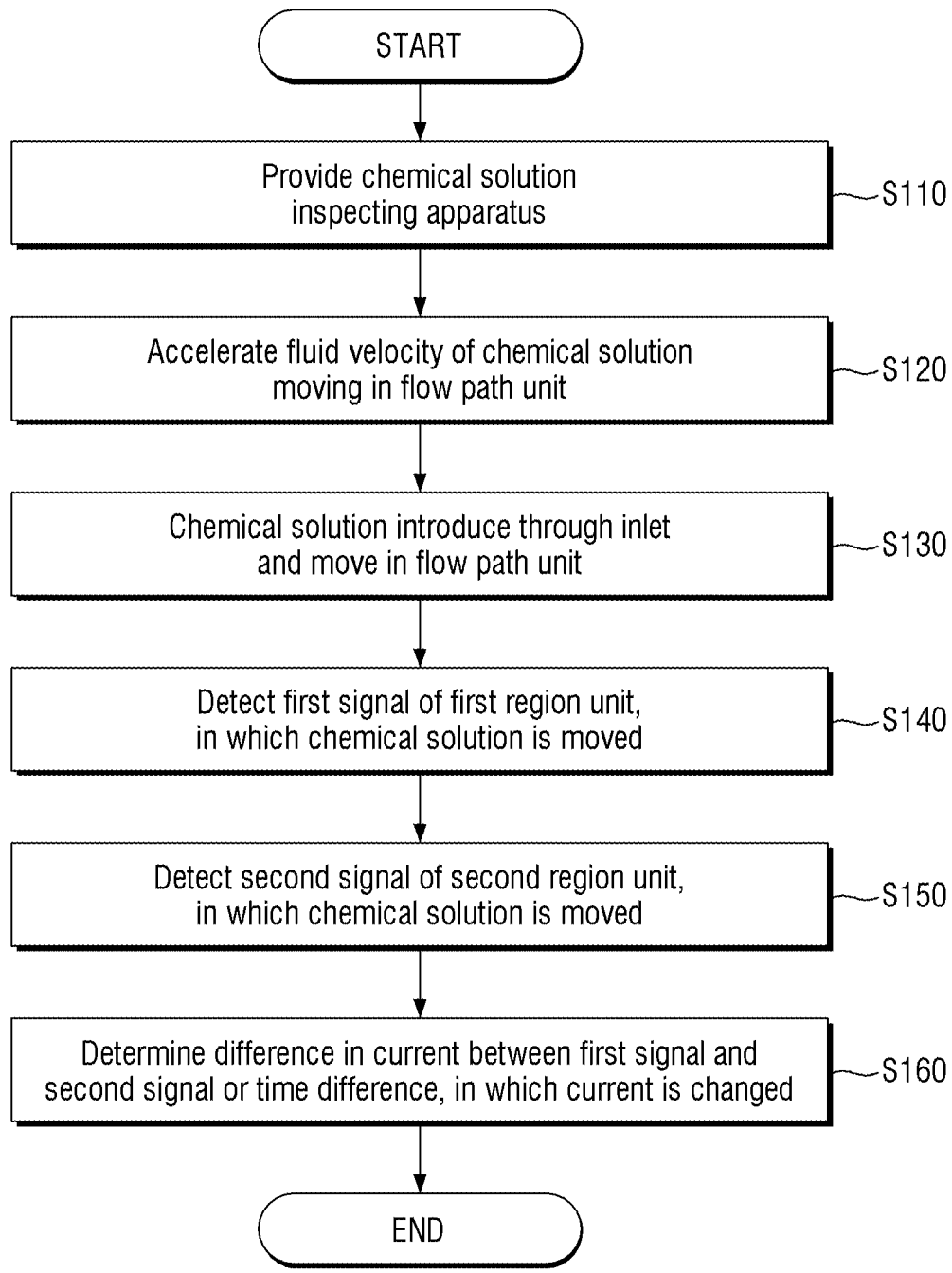

APPARATUS FOR INSPECTING DROPLET AND SUBSTRATE PROCESSING APPARATUS INCLUDING THE SAME

This application claims the benefit of Korean Patent Application No. 10-2021-0171089, filed on Dec. 2, 2021, in the Korean Intellectual Property Office, the disclosure of which is incorporated herein by reference in its entirety.

BACKGROUND

1. Field

The present invention relates to a chemical solution inspecting apparatus and a substrate processing apparatus including the same.

2. Description of the Related Art

Substances such as particles remaining on the surface of the substrate greatly affect the characteristics and production yield of semiconductor devices. For this reason, a cleaning process for removing various contaminants adhering to the substrate surface is important in the semiconductor manufacturing process. A process of cleaning a substrate is performed before and after each unit process of manufacturing a semiconductor. In general, the cleaning of the substrate comprises a chemical processing process that removes particles remaining on the substrate using a chemical solution (processing solution) such as a chemical, a rinse process that removes the chemical remaining on the substrate using pure water, and a drying process that dries the substrate using a dry gas.

However, as the chemical solution is supplied through a pipe or the like, bubbles or particles may be generated in the chemical solution during the process depending on various circumstances. For example, bubbles may be irregularly generated due to the operation of the pump or the on/off operation of the valve in the process of supplying the chemical solution.

In particular, in next-generation semiconductors, the production yield may be affected even if the size of particles, which are foreign substances, is very small, such as in micro (u) units or nano (n) units. Accordingly, it is necessary to remove particles or bubbles of a fine unit.

Bubbles and particles of micro-units such as micro (u) units or nano (n) units have different characteristics and different generating causes, and different removal methods. And, in order to remove bubbles or particles, it is necessary to inspect whether there are bubbles or particles in the chemical solution before removing the bubbles or particles.

SUMMARY

On the other hand, whether or not the bubble is generated can be achieved by an indirect measurement method such as the occurrence of a flow meter abnormality. However, it is difficult to accurately inspect the state of the chemical solution in this way. In addition, it is difficult to inspect the particles in the fluid only based on the abnormality of the flow meter. In addition, SURFSCAN equipment (Program to operate a LASER profilometer) is being developed recently, but these equipment are large in size and expensive. In addition, SURFSCAN equipment can determine the size or position of a defect, but it is difficult to determine whether the cause of the defect is caused by bubbles or particles.

The object of the present invention is to provide a chemical solution inspecting apparatus having a simple structure without using expensive equipment.

Another object of the present invention is to provide a substrate processing apparatus capable of inspecting bubbles and particles only by adding a simple configuration.

The objects of the present invention are not limited to the objects mentioned above, and other objects not mentioned will be clearly understood by those skilled in the art from the following description.

One aspect of a chemical solution inspecting apparatus of the present invention for achieving the above object comprises a base unit having an inlet, through which a chemical solution is introduced; a flow path unit, in which the chemical solution introduced through the inlet is moved while a velocity of its fluid is changed, and including a first region unit provided adjacent to the inlet of the base unit and a second region unit being in series communication with the first region unit, in which the chemical solution discharged from the first region unit is moved; a detecting unit including a first detecting member for detecting a first signal that is an electrical signal of the first region unit, and a second detecting member for detecting a second signal that is an electrical signal of the second region unit; and a determining unit for receiving a signal from the detecting unit and determining that a particle and a bubble are detected if a current of the first signal and the second signal is changed compared to a reference value, and discriminating and determining a particle and a bubble according to a difference in a current between the first signal and the second signal or a time difference, in which a current is changed.

One aspect of a substrate processing apparatus of the present invention for achieving the above another object comprises a chemical solution supply unit for supplying a chemical solution; the chemical solution inspecting apparatus supplied with the chemical solution from the chemical solution supply unit; and a spin chuck, on which at least one of the chemical solution inspecting apparatus and a wafer is disposed.

A chemical inspecting apparatus of the present invention for achieving the above another object comprises a base unit having an inlet, through which a chemical solution is introduced; a flow path unit, in which the chemical solution introduced through the inlet is moved while a velocity of its fluid is changed, and including a first region unit provided adjacent to the inlet of the base unit and a second region unit being in series communication with the first region unit, in which the chemical solution discharged from the first region unit is moved; a detecting unit including a first detecting member for detecting a first signal that is an electrical signal of the first region unit, and a second detecting member for detecting a second signal that is an electrical signal of the second region unit; and a determining unit for receiving a signal from the detecting unit and determining that a particle and a bubble are detected if a current of the first signal and the second signal is changed compared to a reference value, and discriminating and determining a particle and a bubble according to a difference in a current between the first signal and the second signal or a time difference, in which a current is changed, wherein the inlet is provided in a center of the base unit, wherein the flow path unit is provided at least one and is provided radially from a center of the base unit, wherein the flow path unit includes a first section having a first width and a second section having a second width having a larger width compared to the first width, wherein each of the first section and the second section is provided at least one in each of the first region unit and the second region unit, wherein a fluid velocity of the chemical solution passing through the flow path unit is received a rotational force from outside to generate a centrifugal force, so that fluid velocity of the chemical solution moving in the second region unit is increased compared to the first region unit, wherein the detecting unit is electrically connected to the second section.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which:

FIG. 1 is a diagram illustrating a substrate processing apparatus according to a first embodiment of the present invention;

FIG. 2 is a view showing a state, in which the chemical solution inspecting apparatus according to the first embodiment of the present invention is disposed in the chamber;

FIG. 3 is a view showing a state, in which the chemical solution inspecting apparatus according to the first embodiment of the present invention is separated into multiple layers;

FIG. 4 is a view showing a base unit of the chemical solution inspecting apparatus according to the first embodiment of the present invention;

FIG. 5 is a view illustrating a state, in which a fluid containing particles is moved in a flow path unit of the chemical solution inspecting apparatus according to the first embodiment of the present invention;

FIG. 6 is a view illustrating an electrical signal change of the detecting unit of FIG. 5;

FIG. 7 is a view illustrating a state, in which a fluid containing bubbles moves in a flow path unit of the chemical solution inspecting apparatus according to the first embodiment of the present invention;

FIG. 8 is a view illustrating an electrical signal change of the detecting unit of FIG. 7;

FIG. 9a is a view illustrating another modified example of a first region unit and a second region unit of the flow path unit of the chemical solution inspecting apparatus according to the first embodiment of the present invention;

FIG. 9b is a view showing still another modified example of a first region unit and a second region unit of the flow path unit of the chemical solution inspecting apparatus according to the first embodiment of the present invention;

FIG. 10 is a view illustrating an electrical signal change of the detecting unit of FIG. 9b;

FIG. 11 is a view showing a state, in which the chemical solution inspecting apparatus according to the second embodiment of the present invention is separated into multiple layers;

FIG. 12 is a view showing a base unit of the chemical solution inspecting apparatus according to the third embodiment of the present invention;

FIG. 13 is a view showing a base unit of the chemical solution inspecting apparatus according to the fourth embodiment of the present invention;

FIG. 14 is a view showing a base unit of the chemical solution inspecting apparatus according to the fifth embodiment of the present invention;

FIG. 15 is a view showing a base unit of the chemical solution inspecting apparatus according to the sixth embodiment of the present invention;

FIG. 16 is a view showing a chemical solution inspecting apparatus according to a seventh embodiment of the present invention;

FIG. 17 is a view showing a chemical solution inspecting apparatus according to an eighth embodiment of the present invention;

FIG. 18 is a view illustrating a substrate processing apparatus according to a second embodiment of the present invention;

FIG. 19 is a view illustrating a spin chuck of a substrate processing apparatus according to a second embodiment of the present invention; and FIG. 20 is a flowchart for describing a method of inspecting a chemical solution for processing a substrate according to an embodiment of the present invention.

DETAILED DESCRIPTION

Hereinafter, preferred embodiments of the present invention will be described in detail with reference to the accompanying drawings. Advantages and features of the present invention and methods of achieving them will become apparent with reference to the embodiments described below in detail in conjunction with the accompanying drawings. However, the present invention is not limited to the embodiments described below, but may be implemented in various different forms, and these embodiments are provided to make the description of the present invention complete, and fully inform those skilled in the art, to which the present invention pertains on the scope of the invention, and the present invention is only defined by the scope of the claims. Like reference numerals refer to like elements throughout.

The terminology used herein is for the purpose of describing the embodiments and is not intended to limit the present invention. In this description, the singular also includes the plural, unless specifically stated otherwise in the phrase. As used herein, "comprises" and/or "comprising" does not exclude the presence or addition of one or more other components, steps, operations and/or elements mentioned.

FIG. 1 is a view showing a substrate processing apparatus according to a first embodiment of the present invention, and FIG. 2 is a view showing a state, in which the chemical solution inspecting apparatus according to the first embodiment of the present invention is disposed in a chamber. FIG. 3 is a view showing a state, in which the chemical solution inspecting apparatus according to the first embodiment of the present invention is separated into multiple layers, and FIG. 4 is a view showing the base unit of the chemical solution inspecting apparatus according to the first embodiment of the present invention. FIG. 5 is a view illustrating a state, in which a fluid containing particles is moved in a flow path unit of the chemical solution inspecting apparatus according to the first embodiment of the present invention, and FIG. 6 is a view illustrating an electrical signal change of the detecting unit of FIG. 5. And FIG. 7 is a view showing a state, in which the fluid containing bubbles moves in the flow path unit of the chemical solution inspecting apparatus according to the first embodiment of the present invention, and FIG. 8 is a view illustrating an electrical signal change of the detecting unit of FIG. 7.

First, referring to FIGS. 1 and 2, a substrate processing apparatus 1 according to an embodiment of the present invention is an apparatus for processing a substrate (which may be referred to as a wafer hereinafter), and may include a chemical solution supply unit (reference numeral not shown), the chamber 50 and the chemical solution inspecting apparatus 100.

The chemical solution supply unit is a configuration for supplying the chemical solution, and may include a tank 10, a circulation line 20, a supply line 30, and a recovery line 40.

First, one or more tanks 10 may be provided. Referring to FIG. 1, by way of example, two tanks 10 may be provided. The reason the tank 10 is provided in plural is that when the chemical solution (which may be referred to as a fluid hereinafter) in one tank 10 is exhausted, another tank 1 is used as a spare without immediately filling the chemical solution in the supplying tank 10, but is not limited thereto. For example, one or more tanks 10 may be connected to each other, and movement of the chemical solution may be made by the pumping operation of the pump 11. In addition, such as the heater 12 and the like may be connected so that heat is added to the chemical solution, various configuration changes are possible.

In addition, the tank 10 may be connected to a circulation line 20. The circulation line 20 may be connected from the tank 10 to the tank 10, and a supply line 30 and a recovery line 40 to be described later may be connected. And the chemical solution may be supplied from the tank 10 to the chamber 50 through the supply line 30 connected to the circulation line 20. In addition, the recovery line 40 is connected to the circulation line 20, and the chemical solution passing through the circulation line 20 may be recovered back to the tank 10 through the recovery line 40.

In addition, in the circulation line 20, various configurations for controlling the temperature and flow rate of the chemical solution supplied from the tank 10 to the chamber 50 may be provided. For example, the circulation line 20 may include a main pump 21, a damper 22, a main heater 23, a filter 24, a bubble cutter 25, a flow meter 26, a valve (reference numeral not shown), etc. The configuration of the main pump 21, the damper 22, the main heater 23, and the flow meter 26 provided in the circulation line 20 will be omitted in lieu of a known mechanism.

The supply line 30 is a configuration through which the chemical solution supplied to the chamber 50 passes, and may connect between the circulation line 20 and the chamber 50. Accordingly, the chemical solution may move from the circulation line 20 to the chamber 50 via the supply line 30. At this time, the fluid may be pumped by the pumping operation of the main pump 21 provided in the circulation line 20 to generate a flow of the fluid, and the flow rate may be adjusted by adjusting the opening degree of a valve (not shown). In addition, the supply line 30 may be provided with a circulation line 20 and a separate flow meter 31, and various configuration changes are possible.

In addition, the chemical solution may be recovered to the tank 10 through the recovery line 40 branched from the supply line 30. For example, the recovery line 40 may be connected from the supply line 30 to the circulation line 20. And the chemical solution passing through the recovery line 40 may be moved from the supply line 30 to the tank 10 via the circulation line 20. In addition, the three-way valve 32 may be provided at a point where the recovery line 40 is branched from the supply line 30. Accordingly, the chemical solution passing through the supply line 30 may be moved to the chamber 50 via the supply line 30 or the flow direction of the chemical solution may be controlled by the three-way valve 32 such as it is moved from the supply line 30 to the recovery line 40 through the three-way valve 32.

The chamber 50 may receive a chemical solution from the tank 10 through the supply line 30 branched from the circulation line 20 to process the wafer. The chamber 50 may have various structures, in which a space for processing a substrate is formed. Although not shown in the drawings, the chamber 50 may be formed in a box shape. In addition, a spin chuck 51 for rotating a substrate (not shown) while maintaining it horizontally may be provided in the chamber 50. In addition, the chamber 50 may be provided with a cup unit 55 in the form of a cylinder for receiving and accommodating the chemical solution discharged from the substrate or the chemical solution discharged from the chemical solution inspecting apparatus 100. In addition, various modifications are possible according to the change of various configurations, and known techniques may be combined.

For example, the chamber 50 may be a cleaning chamber provided in a cleaning process. That is, the substrate processing apparatus 1 of the present embodiment may supply a chemical solution to the chamber 50 used in the substrate cleaning process. The chemical solution supplied to the chamber 50 for the cleaning process may be, for example, an alkaline chemical solution, an acidic chemical solution, a rinse solution, ozone water, and IPA (isopropyl alcohol) as a cleaning solution.

However, the present invention is not limited to the cleaning process, and may be applied to various processes of supplying a chemical solution if it does not conflict with the present embodiment. As another example, the chamber 50 may be a chamber for a drying process or an etching process. And it may also be changed to a configuration on the circulation line 20 described above or a configuration for a drying process or an etching process. In addition, when the chamber 50 is configured as a chamber for a drying process or an etching process, the chemical solution may be a drying solution or an etchant as a processing solution. However, since this is only an example, the present invention is not limited thereto.

In addition, the chamber 50 is not limited to any one of a cleaning process or an etching process, and any one or more of a cleaning process, a drying process, and an etching process may be included. In addition to these processes, chambers of other processes not mentioned in this embodiment may be included unless conflicting with this embodiment.

Meanwhile, the substrate processing apparatus 1 may perform a process other than cleaning or etching, and may perform a photolithography process for processing the substrate. In other words, the substrate processing apparatus 1 of the present embodiment may be applied to various processes of supplying a chemical solution.

As another example, when the substrate processing apparatus 1 performs a photolithography process, the chemical solution may be a photoresist as the processing solution. This will be described later with reference to FIGS. 18 and 19.

And as mentioned above, in the substrate processing apparatus 1, the bubble cutter 25 may be provided on the circulation line 20. Bubbles may be removed by the bubble cutter 25, but bubbles may be generated again downstream of the bubble cutter 25 during the process, or it may be difficult to remove the fine bubbles by the bubble cutter 25. In addition, the particles may not be removed by the bubble cutter 25 and remain in the fluid. Bubbles and particles need to be removed as they can affect the characteristics and production yield of semiconductor devices (wafer workpieces).

That is, bubbles and particles may be irregularly generated in the process of processing the wafer. In addition, since bubbles and particles have different characteristics, methods of removing bubbles and particles may be different. In addition, bubbles and particles are not always generated by the same phenomenon in a fluid. Accordingly, in order to remove or manage bubbles and particles, it is necessary to inspect whether the fluid contains bubbles or particles. For this purpose, the chemical solution inspecting apparatus 100 may be provided.

Hereinafter, the chemical solution inspecting apparatus 100 will be described. However, prior to this, referring to particles and bubbles having different characteristics are as follows.

Since particles are made of solids and there is no change in diameter (or size) of the particles relative to bubbles, regardless of pressure changes (which can be caused by changes in the velocity of the fluid), it can be the same regardless of the velocity of the fluid. On the other hand, since the bubble contains gas (air, etc.) therein, when the pressure is changed, the diameter of the bubble may be changed due to a change in the volume of the gas. As such, particles and bubbles may have different characteristics with respect to the velocity and pressure of the fluid. In addition, the chemical solution has a high conductivity compared to particles or bubbles, so that a current can easily pass therethrough. On the other hand, particles and bubbles have low conductivity and can act as a resistance to current.

According to these characteristics, the chemical solution inspecting apparatus 100 may detect a particle or a bubble by detecting a change in a current signal, specifically as follows. However, it should be noted that one or more of the embodiments of the present specification may be combined, and the drawings of other embodiments may be referred to for convenience of description and understanding.

Referring to FIGS. 3 to 7, in the chemical solution inspecting apparatus 100 according to an embodiment of the present invention, a chemical solution for processing a wafer may be supplied from a chemical solution supply unit.

That is, the chemical solution inspecting apparatus 100 may be disposed on the spin chuck 51, on which the wafer is disposed, and receive the chemical solution supplied to the wafer to inspect the chemical solution. In addition, the chemical solution inspecting apparatus 100 may be separated without being fixed to the spin chuck 51, and may be disposed on the spin chuck 51 only when the chemical solution inspection is required. However, the present embodiment is not limited thereto, and a structure, in which it is embedded in the spin chuck 51, may be formed. Accordingly, the spin chuck 51 and the chemical solution inspecting apparatus 100 may be integrally formed. When the spin chuck 51 and the chemical solution inspecting apparatus 100 are integrally formed, various modifications may be possible such as the chemical solution inspecting apparatus 100 may support the wafer together with the spin chuck 51 in the process of processing the wafer.

The chemical solution inspecting apparatus 100 disposed on the spin chuck 51 may be rotated together with the spin chuck 51 according to the rotation of the spin chuck 51. Accordingly, the rotational force of the spin chuck 51 may be delivered to the chemical solution inspecting apparatus 100. However, the rotational force of the chemical solution inspecting apparatus 100 is not limited to only be generated by the operation of the spin chuck 51. Through various changes in the configuration, the chemical solution inspecting apparatus 100 may generate a rotational force by itself, which will be described later with reference to FIGS. 16 and 17.

The chemical solution inspecting apparatus 100 of this embodiment may include a base unit 110, a flow path unit 120, a detecting unit 130, a determining unit 140, a layer unit 150, and a battery 160 to inspect particles and bubbles of the fluid.

The base unit 110 may form the exterior of the chemical solution inspecting apparatus 100 together with the layer unit 150. The shape of the base unit 110 is not limited, but may be illustratively the same as or similar to that of the wafer. This is to move the chemical solution inspecting apparatus 100 by the robot moving the wafer in the same manner or method.

In addition, the base unit 110 may have an inlet 1101, through which a fluid is introduced, for movement of the fluid, and may include a first body 111 and a second body 112.

The inlet 1101 of the base unit 110 may be provided, for example, in the center of the base unit 110. This is to increase the velocity of the fluid by centrifugal force while the fluid introducing into the chemical solution inspecting apparatus 100 is discharged from the center of the base unit 110 toward the outside. Accordingly, various modifications may be included in the present embodiment, as long as the velocity of the fluid can be increased.

On the other hand, since the inlet 1101 of the base unit 110 has to face the nozzle, various modifications are possible such as the inlet 1101 may be provided at a position eccentric from the center of the base unit 110 depending on the position of the nozzle. Exemplarily, when two nozzles, to which the cleaning solution and the photoresist are supplied, are provided adjacent to each other, the inlet 1101 may be provided to be located at each of the two nozzles to individually inspect the cleaning solution and the photoresistor.

The first body 111 may have a thickness such that the channel member 110A of the flow path unit 120 is formed (see FIG. 12). Here, the thickness of the first body 111 may be the thickness such that the channel member 110A formed in an intaglio shape can be manufactured. However, the present invention is not limited thereto, and the first body 111 may have a thickness greater than or equal to a certain level so that the chemical solution inspecting apparatus 100 is not easily damaged. In this case, the thickness above a certain level may be variously modified according to the material of the base unit 110.

The second body 112 is a configuration that covers the first body 111 (see FIG. 12), and may be made of a plate or a thin film (FIG. 12 shows a state, in which a part of the second body 112 is cut to show the inside, that is, to show the channel member 110A of the first body 111). In other words, when the flow path unit 120 is formed in an intaglio shape on the upper surface of the first body 111, a structure, in which the upper end of the flow path unit 120 is opened, can be achieved. At this time, the second body 112 may form a structure covering the upper portion of the first body 111 so that the fluid does not leak to the upper portion of the first body 111.

However, the first body 111 and the second body 112 are not limited to being provided separately. Such as the first body 111 and the second body 112 may be integrally formed according to the change of the embodiment, various modifications are possible.

In addition, the base unit 110 may have various modifications of the first body 111 and the second body 112 according to the structure of the flow path unit 120. In addition, the shape of the base unit 110 may be, for example, a disk shape, but is not limited thereto. In other words, the base unit 110 may have various modifications, in which the flow path unit 120 can be formed and the velocity of the fluid can be accelerated.

As another example, the base unit 110 may have a shape similar to that of a propeller, and this will be described with reference to FIG. 15. In addition, although the base unit 110 of this embodiment has been exemplified to form a horizontal plate structure, other modifications are possible. This will be described later with reference to FIG. 17.

The flow path unit 120 is a configuration, in which a fluid is moved, and the chemical solution introducing into the base unit 110 may be moved while the velocity of the fluid is changed. In the chemical solution moving in the flow path unit 120, the velocity of the fluid may be gradually increased from the inlet 1101 to the outlet of the base unit 110 according to the centrifugal force generated by the rotation of the base unit 110. In other words, in the fluid moving in the flow path unit 120, the velocity of the fluid can be gradually increased by centrifugal force in the process of introducing into the base unit 110 and then moving in the outer direction of the chemical solution inspecting apparatus 100 (or discharging to the outside of the chemical solution inspecting apparatus 100).

The number, shape, and structure of the flow path unit 120 may be variously modified. First, the number of flow path unit 120 may be one or more. For example, referring to FIGS. 3 and 4, an inlet 1101, through which a fluid is introduced, may be provided at the center of the base unit 110, and the flow path unit 120 may be connected to the inlet 1101 and may be provided in plural radially from the center of the base unit 110. In addition, the flow path unit 120 may be provided in a straight direction from the inlet 1101 toward the outside. However, the shape of the flow path unit 120 is not limited thereto. Modifications of the shape of the flow path unit 120 will be described later with reference to FIGS. 12 to 14.

As mentioned above, the chemical solution moving in the flow path unit 120 has a different velocity of the fluid depending on the position. In addition, if the pressure is changed according to the difference in the velocity of the fluid, the diameter of the bubble may also be changed. Then, the resistance can be changed and the electrical signal can also be changed, so the bubble can be detected through this change. In order to easily describe such a mechanism, the flow path unit 120 may be described by being divided into positions.

Briefly, the flow path unit 120 may include a first region unit 121 and second region units 122 and 123 that are divided by positions. In addition, the flow path unit 120 may include a first section 1201 and a second section 1202 divided by a width. Although it will be described later, in part, since the first region unit 121/second region units 122, 123 and the first section 1201/second section 1202 are different from each other, the first section 1201 and the second section 1202 may be provided in the first region unit 121. In addition, a first section 1201 and a second section 1202 may be provided in the second region units 122 and 123. That is, the first region unit 121 and the second region units 122 and 123 may be formed of a combination of the first section 1201 and the second section 1202, and thus may have the same shape. In addition, the flow path unit 120 may have various modifications in structure, for example, may include a channel member 110A. The flow path unit 120 will be described as follows.

The flow path unit 120 may have a structure, in which the first region unit 121 and the second region units 122 and 123 forming the fluid passage are connected to each other and have a length. However, the first region unit 121 and the second region units 122 and 123 may be different only in position and may have the same shape. That is, the difference between the first region unit 121 and the second region units 122 and 123 is that the separation distance from the inlet 1101 is different. For example, the first region unit 121 may be provided adjacent to the inlet 1101 of the base unit 110. Accordingly, the fluid introducing into the inlet 1101 may pass through the first region unit 121 to move to the outside of the base unit 110. In addition, the second region units 122 and 123 may communicate in series with the first region unit 121 so that the fluid discharged from the first region unit 121 may move. That is, the first region unit 121 and the second region units 122 and 123 may be provided in a line from the inlet 1101 of the base unit 110.

The first region unit 121 and the second region units 122 and 123 are for the detecting unit 130 to detect electrical signals of two regions having different fluid velocities, so the positions of the first region unit 121 and second region units 122 and 123 may be divided from each other in the front-rear (upstream-downstream) direction of the flow path unit 120.

In other words, the first region unit 121 and the second region units 122 and 123 may have, for example, the same area in the electrical inspection region so that the electrical inspection region provides the same environment. That is, the number or range of the first section 1201 and the second section 1202 located in the first region unit 121 and the second region units 122 and 123 may be the same as each other.

In this regard, referring to FIGS. 5 and 7 (the flow of the chemical solution is moved from left to right on the basis of FIGS. 5 and 7), the first region unit 121 may form a region including each of the first section 1201 and the second section 1202 by one. In this case, it can be seen that the second section 1202 is not divided into a region between the two first sections 1201, but is divided into a constant region in the front-rear direction of one first section 1201. This is also the same for the second region units 122 and 123. As described above, the first region unit 121 and the second region units 122 and 123 may form the same environment/region for detecting electricity in the detecting unit 130.

In addition, since the first region unit 121 and the second region units 122 and 123 are divided in the front-rear direction with respect to the longitudinal direction of the flow path unit 120, the positions of the second region units 122 and 123 is not limited to being located immediately after the first region unit 121.

That is, as shown in FIGS. 5 and 7, the second region units 122 and 123 may be located immediately after the first region unit 121 (reference numeral 122 means the second region unit 122), or may be provided at positions spaced apart from each other by a predetermined distance (reference numeral 123 means the second region unit 123). As such, various modifications are possible.

In the present embodiment, the second region units 122 and 123 are provided in plural, but this is to be contrasted with the first region unit 121 individually. That is, the electrical signal of the first region unit 121 may be contrasted with the second region unit 122 or may be contrasted with the second region unit 123. Alternatively, the electrical signals of the plurality of second region units 122 and 123 may be contrasted.

Furthermore, each of the first region unit 121 and second region units 122 and 123 is not limited to including one first section 1201 and one second section 1202. This will be described later with reference to FIGS. 9a and 9b.

Next, the first section 1201 and the second section 1202 of the flow path unit 120 will be described as follows.

The first section 1201 may form a first width (see FIG. 5, see reference numeral 'W1'). The second section 1202 may form a second width (see FIG. 5, see reference numeral 'W2') that is larger than the first width.

For example, the reason that the widths of the first section 1201 and the second section 1202 are different is that at least some sections are formed to have a small width in order to precisely detect a change in resistance caused by particles or bubbles. In other words, the change in the resistance value may have a large ratio change in a section having a small width compared to a section having a large width. Accordingly, the flow path unit 120 includes the first section 1201 so that the width of at least some sections of the region, in which the detecting unit 130 detects the electrical signal, is formed to be small.

Illustratively, particles or bubbles (which may be fine bubbles) may be formed in micro (u) units or nano (n) units. Then, the diameter of the first section 1201 may have a diameter capable of moving a fluid including a plurality of particles or bubbles, and may be formed in a micro unit or a nano unit. For example, one particle may be 1 nanometer, and the diameter of the first section 1201 may be 20 nanometers to 100 nanometers.

However, the unit of the diameter of the first section 1201 is not limited to micro units or nano units, and various modifications are possible as long as they do not conflict with the present embodiment, such as it may be made in millimeters (mm) units.

One or more of each of the first section 1201 and the second section 1202 may be provided in each of the first region unit 121 and the second region units 122 and 123. Accordingly, in the first region unit 121, one or more first sections 1201 and one or more second sections 1202 may be provided, so that the first sections 1201 and second sections 1202 may be alternately provided. In the same way, one or more first sections 1201 and one or more second sections 1202 may be provided in the second region units 122 and 123.

In addition, the flow path unit 120 of the present embodiment may be formed by the shape or structure of the base unit 110. For example, the flow path unit 120 may include a channel member 110A having an intaglio shape or a penetrating structure so that the first region unit 121 and the second region units 122 and 123 are formed.

The intaglio processing can be made on the intaglio-shaped channel member 110A such that the base unit 110 forms a space corresponding to the shape of the flow path unit 120 (which may be the shape of the first section 1201 and the second section 1202). The channel member 110A of a penetrating structure may have a structure penetrating the first body 111, and in this case, the first body 111 and the second body 112 may be integrally formed. And, as for the channel member 110A, the first body 111 of the base unit 110 may be provided with an intaglio shape by laser processing, but various other modifications are possible.

In addition, the flow path unit 120 may be formed of an embossed structure in addition to an intaglio shape or penetrating structure. The embossed structure may be made of a partition wall member 110B, which will be described later with reference to FIG. 13.

The detecting unit 130 may detect an electrical signal (which may be an electrical signal of a chemical solution) in the detecting unit 130 so that the determining unit 140 can determine the difference of the electrical signals in the flow path unit 120. The connection of the detecting unit 130 may be electrically connected to the second section 1202 having a relatively wide second width compared to the first section 1201. In this case, it may have a structure, in which a chemical solution having conductivity flows between both ends of the detecting unit 130, and the chemical solution and the detecting unit 130 are connected in series. And, as mentioned above, the first section 1201 may form a section, in which the resistance value is changed by bubbles and particles.

The detecting unit 130 may include a first detecting member 131 and a second detecting member 132 capable of detecting electrical signals of the first region unit 121 and the second region units 122 and 123. The first detecting member 131 and the second detecting member 132 may be different only in a region for measuring an electrical signal, but may have the same function and operation. For example, the first detecting member 131 may detect a first signal that is an electrical signal of the first region unit 121. The second detecting member 132 may detect a second signal that is an electrical signal of the second region units 122 and 123. In addition, the first detecting member 131 and the second detecting member 132 may be formed of an ammeter to detect an electrical signal in the same or similar manner.

The electrical signal detection of the detecting unit 130 will be described as follows. However, prior to the description, it should be mentioned that the reference numerals CH1, CH2, and CH3 of FIGS. 6 and 8 denote the first region unit 121 and the second region units 122 and 123 of FIGS. 5 and 7. That is, CH1 is used to describe a change in the electrical signal of the first region unit 121. CH2 and CH3 are used to describe changes in electrical signals of the second region units 122 and 123.

Referring to FIGS. 6 and 8, three lines extending in a horizontal direction are shown. Here, in the three lines, an imaginary horizontal axis may mean time. And an imaginary vertical axis may mean the amount of change of the current. An electrical signal is generated from the reference point where the three lines are the same, and when particles or bubbles are included in the fluid, the particles or bubbles act as resistance, and a change occurs in the vertical direction, which is the current value. The difference between electrical signals for particles and bubbles is as follows.

First, as shown in FIG. 6, since the lengths of the horizontal axes are the same in the section, in which the change in the vertical direction occurs, it can be seen that the time of the change in current detected by the first detecting member 131 and the second detecting member 132 is the same. This is because, as mentioned above, even when the velocity of the fluid is increased, the particle does not change in diameter, so that the resistances of the first region unit 121 and the second region units 122 and 123 are the same.

Next, as shown in FIG. 8, it can be seen that the time of the change in current detected by the first detecting member 131 and the second detecting member 132 is different from each other. This is because, when the velocity of the fluid is increased, the volume of the bubble is changed according to the change in pressure, and thus the first region unit 121 and the second region units 122 and 123 act as resistances having different sizes.

When the current of the first signal and the second signal detected by the detecting unit 130 is changed in comparison with the reference value (e.g., it may be a current value of a fluid that does not contain particles and bubbles), the determining unit 140 may determine that particles and bubbles are detected.

In addition, the determining unit 140 may receive the signal from the detecting unit 130, and discriminate and determine particles and bubbles according to the difference in the current between the first signal that is the electrical signal of the first region unit 121 and the second signal that is the electrical signal of the second region unit 122 and 123 or the time difference, in which the current is changed.

The determining unit 140 may determine that the fluid contains particles when the difference in current between the first signal and the second signal or the time difference in which the current is changed is 0. In addition, the determining unit 140 may determine that the fluid contains bubbles when a difference in current between the first signal and the second signal or a time difference in which the current is changed occurs. In this way, the determining unit 140 can not only determine that particles and bubbles are included in the fluid, but can also discriminate and determine between particles and bubbles. In addition, the determining unit 140 may include a display device, a memory chip, a data reader device, etc. for continuous management of the substrate processing apparatus 1.

In the layer unit 150, the detecting unit 130, the determining unit 140, and the battery 160 may be disposed and installed. The layer unit 150 may be provided on one surface or the other surface of the base unit 110. One or more layer units 150 may be provided.

Referring to FIG. 3, one layer unit 150 may be provided, and the configuration as the battery 160 may be installed in one layer unit 150. Contrary to this, a plurality of layer units 150 may be provided to form multiple layers, which will be described later with reference to FIG. 11.

In addition, the layer unit 150 may have the same diameter or cross-sectional area as the diameter or cross-sectional area of the base unit 110 so that a step is not formed with the base unit 110. However, this is only an example, and various modifications are possible such as it may have a diameter or a cross-sectional area within 10% difference.

In addition, the battery 160, which is not described, may supply power to the detecting unit 130 or the determining unit 140. For example, the battery 160 may be formed in a thin film type in order to make the chemical solution inspecting apparatus 100 compact, but is not limited thereto.

In such a chemical solution inspecting apparatus 100, the chemical solution inspecting apparatus 100 is rotated by the operation of the spin chuck 51 or the base unit 110 may be rotated by the driving unit 170 of another embodiment to be described later. And a centrifugal force may be generated in the base unit 110. Then, while the fluid moves in the flow path unit 120, the fluid velocity of the second region units 122 and 123 may be increased compared to the fluid velocity of the first region unit 121. In this case, the pressure of the fluid may be reduced in the second region units 122 and 123 compared to the first region unit 121 due to the velocity difference of the fluid. As such, when the velocity difference is generated by the centrifugal force, a change in pressure is generated, and as mentioned above, the change in diameter of particles and bubbles may be different from each other.

As such, by detecting and determining electrical signals of the first region unit 121 and second region units 122 and 123, in which the velocity difference of the fluid is occurred by centrifugal force, it is detected whether bubbles or particles are included in the fluid.

Hereinafter, modified examples of the first region unit 121 and the second region units 122 and 123 will be described with reference to FIGS. 9A to 10.

FIG. 9a is a view showing another modified example of the first region unit and the second region unit of the flow path unit of the chemical solution inspecting apparatus according to the first embodiment of the present invention, and FIG. 9b a view showing still another modified example of the first region unit and the second region unit of the flow path unit of the chemical solution inspecting apparatus according to the first embodiment of the present invention. FIG. 10 is a view illustrating an electrical signal change of the detecting unit of FIG. 9b.

First, referring to FIG. 9a, the flow path unit 120 may include a first region unit 121 and a second region unit 122 in the same or similar manner to the aforementioned embodiment. However, the present embodiment is different in that each of the first region unit 121 and the second region unit 122 includes at least one first section 1201 and at least one second section 1202.

For example, in the first region unit 121, two first sections 1201 and three second sections 1202 may be alternately located with each other. Similarly, in the second region unit 122, two first sections 1201 and three second sections 1202 may be alternately located with each other. And, of course, the second region unit 122 may be located immediately after the first region unit 121 or may be provided at a position more than a certain distance away.

In addition, one or more of the first detecting member 131 and the second detecting member 132 of the detecting unit 130 may be provided in each of the first region unit 121 and the second region unit 122. For example, as shown in FIG. 9a, two first detecting members 131 may be provided in the first region unit 121, and two second detecting members 132 may be provided in the second region unit 122. In addition, each of the one or more first detecting members 131 and the one or more second detecting members 132 is calculated as an average value, and the electrical signal differences of the first region unit 121 and the second region unit 122 may be determined or individual electrical signals may all be contrasted by the determining unit 140.

However, it is not limited to providing at least one first detecting member 131 and at least one second detecting member 132 in each of the first region unit 121 and the second region unit 122, and other modifications are possible.

Referring to FIG. 9b, each of the first region unit 121 and the second region unit 122 may include one or more first sections 1201 and one or more second sections 1202. In addition, one first detecting member 131 and one second detecting member 132 may be electrically connected to each of the first region unit 121 and the second region unit 122.

In addition, in the first region unit 121 and the second region unit 122 of the present embodiment, the number of the first section 1201 and the second section 1202 is provided in plural, so that there is a difference from the first embodiment in that the region for detecting an electrical signal is expanded. Therefore, the electrical signal detection can be made in the same principle and form. Referring to FIG. 10 in this regard, as follows.

Referring to FIG. 10, when particles are included in the fluid, it can be seen that the time of the change in currents detected by the first detecting member 131 and the second detecting member 132 are the same. In addition, although not shown in the drawings, when bubbles are included in the flow path unit 120 of the present embodiment, the change time of the electrical signal may be different. This is the same as the above-described technical feature, so a duplicate description will be omitted.

Hereinafter, a modified example of the present embodiment will be described with reference to FIGS. 11 to 16, and a redundant description of the same configuration having the same function will be omitted. In addition, it is mentioned that even if there are some differences in the configurations constituting the same reference numeral, the same reference numeral may be used if the functions are the same. In addition, it should be noted that another embodiment is possible by combining at least any one of the first to eighth embodiments.

FIG. 11 is a view showing a state, in which the chemical solution inspecting apparatus according to the second embodiment of the present invention is separated into multiple layers. With reference to FIG. 11, differences from those described with reference to FIG. 3 will be mainly described.

The chemical solution inspecting apparatus 100 according to an embodiment of the present invention is the same as or similar to the first embodiment in that a base unit 110, a flow path unit 120, a detecting unit 130, a determining unit 140, a layer unit 150 and a battery 160 are included so as to inspect particles and bubbles of a fluid.

However, the chemical solution inspecting apparatus 100 of the present embodiment is different in that the layer unit 150 is provided with a plurality of layers 151 and 152. The layer unit 150 provided with one or more layers 151 and 152 may be made of an optimized thickness and material according to a conductive wire (see FIGS. 3 and 11, reference numeral 'W'), a detecting unit 130, a determining unit 140, and a battery 160, etc.

For example, a conductive wire may electrically connect the detecting unit 130 and the flow path unit 120. In particular, if the diameter of the flow path unit 120 is minute, such as in millimeters (mm), the conductive wire may have a manufacturing method or structure, in which defects due to manufacturing errors are minimized while electrical connection is made to the flow path unit 120. Illustratively, a manufacturing method, in which a conductive material can be manufactured in detail, such as circuit formation using a mask in a semiconductor manufacturing process, may be applied to the conductive wire, but this is only an example.

In addition, the layer 152, in which the detecting unit 130 is provided, may be thick compared to the layer 151, in which the conductive wire is provided, so that a thickness and structure, in which the battery 160 is stably fixed, is achieved, unlike the layer 151, in which the conductive wire is provided, but is not limited thereto. In this way, various modifications are possible for the layer unit 150 according to the arrangement and installation of the conductive wire and the battery 160.

Hereinafter, various shapes of the flow path unit 120 will be described.

FIG. 12 is a view showing a base unit of the chemical solution inspecting apparatus according to the third embodiment of the present invention. With reference to FIG. 12, points different from those described with reference to FIGS. 3 and 4 will be mainly described.

The chemical solution inspecting apparatus 100 according to an embodiment of the present invention is the same as or similar to the first embodiment in that a base unit 110, a flow path unit 120, a detecting unit 130, a determining unit 140, a layer unit 150 and a battery 160 are included so as to inspect particles and bubbles of a fluid.

However, the chemical solution inspecting apparatus 100 of this embodiment is different in that the shape of the flow path unit 120 is not provided in a straight shape but is provided in a curved shape.

For example, the flow path unit 120 may be provided radially from the center of the base unit 110 in the same or similar to the flow path unit 120 illustrated in FIG. 4. However, the flow path unit 120 of the present embodiment may be provided in a curved shape toward the outside from the inlet 1101 of the base unit 110. This may be the same as or similar to the shape of the flow path unit 120 shown in FIG. 13 to be described later.

The flow path unit 120 provided in a curved shape is to allow the fluid to move in a direction perpendicular to the centrifugal force generated by the rotational force. Accordingly, the movement of the fluid may be further facilitated.

In addition, according to a modification of the embodiment, the channel member 110A may be formed in the flow path unit 120. Here, since the channel member 110A is the same as the description described above, the overlapping description will be omitted.

FIG. 13 is a view showing a base unit of the chemical solution inspecting apparatus according to the fourth embodiment of the present invention. With reference to FIG. 13, differences from those described with reference to FIGS. 3, 4 and 12 will be mainly described.

The chemical solution inspecting apparatus 100 according to an embodiment of the present invention is the same as or similar to the first embodiment in that a base unit 110, a flow path unit 120, a detecting unit 130, a determining unit 140, a layer unit 150 and a battery 160 are included so as to inspect particles and bubbles of a fluid.

In addition, the flow path unit 120 of this embodiment may be provided radially from the center of the base unit 110 in the same as or similar to the flow path unit 120 of FIG. 13 described above.

However, there is a difference in that the base unit 110 is not made of the channel member 110A, but is made of the partition wall member 110B.

In other words, one or more flow path units 120 of the embodiment with reference to FIGS. 12 and 13 may be provided in a radial shape. In addition, the flow path unit 120 may be formed in a curved shape. The curvature of the curve may be made in a straight direction with respect to the centrifugal force caused by the rotational force generated in the base unit 110.

Meanwhile, the flow path unit 120 of FIG. 12 has an intaglio structure by the channel member 110A, whereas the flow path unit 120 of this embodiment may include a partition wall member 110B. The partition wall member 110B may have an embossed structure to form an embossed shape unlike the intaglio shape.

For example, the partition wall member 110B may have a protruding structure that forms a space, in which the first section 1201 and the second section 1202 are alternately formed. That is, the partition wall member 110B may form a protruding structure extending from the first body 111 to the second body 112 along the shapes of one or more first sections 1201 and one or more second sections 1202.

The partition wall member 110B is different from the channel member 110A in that it has an embossed structure rather than an intaglio structure. That is, the formation of the first region unit 121 and the second region units 122 and 123 may be the same. Of course, since the first region unit 121 and the second region units 122 and 123 include the first section 1201 and the second section 1202, the first section 1201 and the second section 1202 may be formed in the partition wall member 110B in the same manner as in the above-described embodiments.

As described above, the partition wall member 110B may be formed in an embossed shape from the first body 111 to the second body 112 along both sides of the fluid movement path so that the first region unit 121 and the second region units 122 and 123 are formed in the flow path unit 120.

FIG. 14 is a view showing a base unit of the chemical solution inspecting apparatus according to the fifth embodiment of the present invention. With reference to FIG. 14, differences from those described with reference to FIGS. 3, 4, 12 and 13 will be mainly described.

Referring to FIG. 14, the flow path unit 120 of the present embodiment may be formed in a curved shape in the same as or similar to the flow path unit 120 of the embodiment with reference to FIGS. 12 and 13.

However, one flow path unit 120 of the present embodiment may be provided in an outer direction from the inlet 1101 of the base unit 110. For example, the flow path unit 120 may be provided in a spiral shape from the center of the base unit 110 toward the outside.

Accordingly, in preparation for the movement of the flow path unit 120 of FIG. 3, the fluid may move long along the flow path unit 120 of the present embodiment. Accordingly, the separation distance between the first region unit 121 and the second region units 122 and 123 may be increased.

FIG. 15 is a view showing a base unit of the chemical solution inspecting apparatus according to the sixth embodiment of the present invention. With reference to FIG. 15, points different from those described with reference to FIGS. 3, 4 and 12 to 14 will be mainly described.

The base unit 110 of the present embodiment is different from the base unit 110 described above in that it does not have a disk structure and has a different shape.

Referring to FIG. 15, similar to the shape of the propeller, the base unit 110 may have a structure having a predetermined area radially from the center. However, in the present embodiment, it is described that the area of the base unit 110 gradually expands from the center toward the outside. However, the present invention is not limited thereto, and various embodiments are possible, such as the base unit 110 may have a structure extending in the same area from the center toward the outside. Various types of flow path units 120 described above may be provided on the base unit 110.

Hereinafter, various modifications, in which the chemical solution inspecting apparatus 100 is rotated by itself, will be described.

FIG. 16 is a view showing a chemical solution inspecting apparatus according to a seventh embodiment of the present invention. Referring to FIG. 16, points different from those described with reference to FIGS. 3 to 15 will be mainly described.

Referring to FIG. 16, the chemical solution inspecting apparatus 100 according to an embodiment of the present invention is the same as or similar to that of the first embodiment in that a base unit 110, a flow path unit 120, a detecting unit 130, a determining unit 140, a layer unit 150 and a battery 160 are included so as to inspect particles and bubbles of a fluid.

On the other hand, the chemical solution inspecting apparatus 100 of the present embodiment is different in that the driving unit 170 is further provided.

The driving unit 170 is configured to rotate the base unit 110, and may be connected to one surface or the other surface of the base unit 110. For example, the driving unit 170 may include a motor 171 having a rotating shaft 172 connected to a lower portion of the base unit 110.

The motor 171 may be connected to the battery 160 provided in the layer unit 150 to receive power and be driven. That is, one battery 160 may supply power to the detecting unit 130, the determining unit 140, and the motor 171. In this case, the conductive wire may be connected in various directions for electrical connection of the battery 160, the detecting unit 130, and the motor 171. However, the present invention is not limited thereto.

As another example, the motor 171 may receive power from a separate power source. Various modifications are possible, such as the power source for supplying power to the motor 171 may be provided in a case of the motor 171.

FIG. 17 is a view showing a chemical solution inspecting apparatus according to an eighth embodiment of the present invention. Referring to FIG. 17, points different from those described with reference to FIGS. 3 to 16 will be mainly described.

Referring to FIG. 17, the chemical solution inspecting apparatus 100 according to an embodiment of the present invention is the same as or similar to that of the first embodiment in that a base unit 110, a flow path unit 120, a detecting unit 130, a determining unit, a layer unit 150 and a battery 160 are included so as to inspect particles and bubbles of a fluid. And similarly to the seventh embodiment, the chemical solution inspecting apparatus 100 of the present embodiment may further include a driving unit 170.

On the other hand, the chemical solution inspecting apparatus 100 of the present embodiment is different in that the auxiliary cup 180 is further provided.

For example, the fluid accommodated in the cup unit 55 in the chamber 50 may contain foreign substances in the process of cleaning the substrate. Therefore, in a state, in which the chemical solution for cleaning the substrate is stored in the cup unit 55, when the chemical solution passing through the chemical solution inspecting apparatus 100 is received, the chemical solution that can be used can be mixed by the chemical solution that has cleaned the substrate only moving in the flow path unit 120. Accordingly, it may be difficult to use a chemical solution that can be cleaned only by performing an inspection. To prevent this, an auxiliary cup 180 may be further provided.

The auxiliary cup 180 has a configuration, in which a space is formed so that the fluid discharged from the flow path unit 120 is separated from the chemical solution accommodated in the cup unit 55. The auxiliary cup 180 may be formed, for example, along the outer circumference of the base unit 110. In addition, the auxiliary cup 180 may have a donut shape with an open top so as not to interfere with the motor 171. However, since the auxiliary cup 180 has a configuration to accommodate the fluid so that the fluid discharged from the flow path unit 120 can be reused, the shape is not particularly limited and various modifications are possible.

In addition, the base unit 110 does not form a horizontal structure, and various modifications are possible. For example, it may have a structure that slopes downward from the center toward the outside. Referring to FIG. 17, the base unit 110 may have a cone shape or a truncated cone shape from which a central portion protrudes.

Meanwhile, the substrate processing apparatus 1 of the first embodiment described above exemplifies supply of a cleaning solution. As another example, the substrate processing apparatus 1 may include a photolithography process. In this case, the chemical solution may be a photoresist as a processing solution. Hereinafter, it will be described with reference to the drawings.

FIG. 18 is a diagram illustrating a substrate processing apparatus according to a second embodiment of the present invention. FIG. 19 is a view illustrating a spin chuck of a substrate processing apparatus according to a second embodiment of the present invention.

Referring to FIGS. 18 and 19, the substrate processing apparatus 1 may include an index unit 60, a processing unit 70, an interface unit 80, and an exposure unit 90.

Briefly, the substrate may move the index unit 60, the processing unit 70, the interface unit 80, and the exposure unit 90 of the substrate processing apparatus 1 vertically and horizontally in a loop type. For example, an interface unit 80 connected to the exposure unit 90 may be provided on one side of the processing unit 70. A robot 81 for transporting a substrate between the exposure unit 90 and the processing unit 70 may be disposed in the interface unit 80. The robot 81 may have a structure capable of multi-axis driving so that a hand for directly handling a substrate can be moved and rotated in three directions.

In addition, a process of applying a photoresist (a photolithography process) and a process of developing the substrate may be performed while the substrate moves in the substrate processing apparatus 1. Exemplarily, a process of applying a photoresist on the substrate before the exposure process and a process of developing the substrate after the exposure process may be performed.

In addition, the process of applying the photoresist and the developing process may be performed in the processing unit 70. The processing unit 70 may include a spin chuck 51A, a developing unit (not shown), and a bake unit (not shown).

The spin chuck 51A of the present embodiment can fix a substrate and rotate the fixed substrate. In addition, if the inspection of the chemical solution is required, the chemical solution inspecting apparatus 100 may be rotated after the chemical solution inspecting apparatus 100 is disposed on the spin chuck 51A. In this case, the movement of the substrate and the chemical solution inspecting apparatus 100 may be performed by a transport robot (not shown).

In addition, a nozzle (reference numeral not shown) for discharging the photoresistor may be provided in the upper portion of the spin chuck 51A. Although not shown in the drawings, the nozzle may be connected to the chemical solution supply unit. In addition, in the substrate processing apparatus 1 of the first embodiment described above, the cup unit 55 for accommodating the cleaning solution is provided, but in the substrate processing apparatus 1 of the present embodiment, the cup unit 55 may be omitted.

Meanwhile, the substrate processing apparatus 1 of this embodiment and the substrate processing apparatus 1 described with reference to FIG. 1 have been described as different embodiments. However, this is only an example, and of course, another embodiment is possible by combining these embodiments. In other words, the substrate processing apparatus 1 includes a spin chuck 51A (or a spin chuck 51), and two nozzles (a nozzle to which a cleaning solution is supplied and a nozzle to which a photoresist is supplied) may be arranged next to each other in the upper portion of the spin chuck 51A. In addition, the substrate processing apparatus 1 may also be provided with a cup unit 55 to accommodate the cleaning solution.

In this way, various modifications of the substrate processing apparatus 1 are possible.

Hereinafter, a method of inspecting a chemical solution using the substrate processing apparatus 1 or the chemical solution inspecting apparatus 100 of the present embodiment will be described with reference to the drawings. In addition, since the configuration of the substrate processing apparatus 1 and the chemical solution inspecting apparatus 100 are the same as those described above, overlapping contents will be omitted.

FIG. 20 is a flowchart for describing a method of inspecting a chemical solution for processing a substrate according to an embodiment of the present invention.

Referring to FIG. 20, in the method of inspecting a chemical solution for processing a substrate according to the present embodiment, the step of providing the chemical solution inspecting apparatus 100 is provided so that the aforementioned substrate processing apparatus 1 or the chemical solution inspecting apparatus 100 can be used (S110), the step of accelerating the fluid velocity of the chemical solution moving in the flow path unit 120 (S120), and the step of the chemical solution introducing into the inlet 1101 and moving in the flow path unit 120 (S130), the step of detecting a first signal of the first region unit 121, in which the chemical solution is moved (S140), and the step of detecting a second signal of the second region units 122, 123, in which the chemical solution is moved (S150) and the step of determining a difference in a current between the first signal and the second signal or a time difference, in which the current is changed (S160) may be included.

First, the chemical solution inspecting apparatus 100 may be provided (S110).

As mentioned above, the chemical solution inspecting apparatus 100 may include a base unit 110, a flow path unit 120, a detecting unit 130, a determining unit 140, a layer unit 150, and a battery 160 to inspect particles and bubbles of a fluid.

When the chemical solution inspecting apparatus 100 is provided, the fluid velocity of the chemical solution moving in the flow path unit 120 may be accelerated (S120).

Accelerating the fluid velocity of the chemical solution may be performed by rotating the provided chemical solution inspecting apparatus 100 or rotating the base unit 110 of the chemical solution inspecting apparatus 100. This can be achieved by disposing the chemical solution inspecting apparatus 100 on the spin chuck 51 and rotating the chemical solution inspecting apparatus 100 by the spin chuck 51. Alternatively, the base unit 110 may be rotated by the motor 171 of the driving unit 170 provided in the chemical solution inspecting apparatus 100. Since a detailed description of this overlaps with the content described above, a detailed description thereof will be omitted.

Meanwhile, as another example, the pressure of the second region units 122 and 123 may be reduced so that the velocity of the fluid moving in the first region unit 121 and the second region units 122 and 123 is increased. That is, since the velocity and pressure of the fluid are in inverse proportion to each other, the pressure of the fluid in the second region units 122, 13 may be reduced so that the velocity of the fluid in the second region units 122 and 123 is increased compared to the first region unit 121.

Next, the chemical solution may be introduced into the inlet 1101 of the base unit 110 to move in the flow path unit 120 (S130).

After moving through the circulation line 20 and the supply line 30 from the tank 10 of the chemical solution supply unit, the chemical solution may be supplied to the inlet 1101 of the base unit 110. The chemical solution supplied to the base unit 110 may sequentially move through the first region unit 121 and the second region units 122 and 123 communicating with the inlet 1101. In this case, the detecting unit 130 may detect the electrical signals of the first region unit 121 and the second region units 122 and 123. Detection of the electrical signal may be achieved by detecting a first signal of the first region unit 121, in which the chemical solution is moved, and a second signal of the second region units 122 and 123.

To this end, the first detecting member 131 may detect a first signal of the first region unit 121, in which the chemical solution is moved (S140). In addition, the first detecting member 131 may detect a second signal of the second region units 122 and 123, in which the chemical solution is moved (S150).

The detection of the first detecting member 131 and the second detecting member 132 may measure a current changed by the resistance action of particles or bubbles. Resistance and electrical signals according to particles or bubbles are the same as those described in the substrate processing apparatus 1.

In addition, the detecting unit 130 detects the electrical signal to detect particles or bubbles spread in the fluid. Accordingly, the detection of the first signal of the first detecting member 131 and the detection of the second signal of the second detecting member 132 may be performed sequentially or simultaneously.

Next, a difference in current between the first signal and the second signal or a time difference, in which the current is changed, may be determined (S160).

For example, the determining unit 140 may determine that the fluid contains particles when the difference in current between the first signal and the second signal or the time difference, in which the current is changed, is 0. In addition, when a difference in current between the first signal and the second signal or a time difference, in which the current is changed, occurs, the determining unit 140 may determine that the fluid contains bubbles.

Although the embodiments of the present invention have been described above with reference to the accompanying drawings, the present invention is not limited to the above embodiments, but may be manufactured in a variety of different forms, and those of ordinary skill in the art to which the present invention pertains can understand that the present invention may be embodied in other specific forms without changing the technical spirit or essential features of the present invention. Therefore, it should be understood that the embodiments described above are illustrative in all respects and not limiting.

REFERENCE NUMERAL

100: inspecting apparatus 110: base unit
120: flow path unit
140: determining unit 150: layer unit
160: battery 170 driving unit

What is claimed is:

1. An apparatus for inspecting a chemical solution comprising:
a base unit having an inlet, through which a chemical solution is introduced;
a flow path unit, in which the chemical solution introduced through the inlet is moved while a velocity of its fluid is changed, and including a first region unit provided adjacent to the inlet of the base unit and a second region unit being in series communication with the first region unit, in which the chemical solution discharged from the first region unit is moved;
a detecting unit including a first detecting member for detecting a first signal that is an electrical signal of the first region unit, and a second detecting member for detecting a second signal that is an electrical signal of the second region unit; and
a determining unit for receiving a signal from the detecting unit and determining that a particle and a bubble are detected if a current of the first signal and the second signal is changed compared to a reference value, and discriminating and determining a particle and a bubble according to a difference in a current between the first signal and the second signal or a time difference of current change durations detected by the first detecting member and the second detecting member.

2. The apparatus of claim 1, wherein by receiving a rotational force from outside or generating a centrifugal force by rotation of the base unit, a fluid velocity of the chemical solution moving in the second region unit is increased compared to the first region unit.

3. The apparatus of claim 1, wherein the determining unit discriminates and determines a particle and a bubble by determining that the chemical solution contains a particle if a difference in a current between the first signal and the second signal or a time difference of current change durations is 0, and determining that the chemical contains a bubble if a difference in current between the first signal and the second signal or a time difference of current change durations occurs.

4. The apparatus of claim 1, wherein the base unit comprises,
a first body; and
a second body covering the first body.

5. The apparatus of claim 4, wherein the flow path unit comprises a channel member passing through the first body or having a groove formed on the first body so that the first region unit and the second region unit are formed.

6. The apparatus of claim 1, wherein the base unit comprises a first body and a second body facing the first body,
wherein the flow path unit comprises a partition wall member formed in a protruded shape from the first body to the second body along both sides of a movement path of the chemical solution so that the first region unit and the second region unit are formed.

7. The apparatus of claim 1, wherein the inlet is provided in a center of the base unit,
wherein the flow path unit is provided with one flow path unit or a plurality of flow path units and provided in a radial direction from a center of the base unit.

8. The apparatus of claim 7, wherein the flow path unit is provided in a linear direction from the inlet toward outside.

9. The apparatus of claim 7, wherein the flow path unit is provided in a curved shape from the inlet toward outside.

10. The apparatus of claim 1, wherein the inlet is provided in a center of the base unit,
wherein the flow path unit is provided in a spiral shape from a center of the base unit toward outside.

11. The apparatus of claim 1, wherein the flow path unit includes a first section having a first width and a second section having a second width having a larger width compared to the first width,
wherein each of the first section and the second section is provided at least one in each of the first region unit and the second region unit.

12. The apparatus of claim 11, wherein the detecting unit is electrically connected to the second section.

13. The apparatus of claim 1 further comprises,
a layer unit provided on the base unit, and in which the detecting unit and the determining unit are disposed.

14. The apparatus of claim 13, wherein the layer unit has the same cross-sectional area as the base unit or has a cross-sectional area within 10% difference from the base unit,
the apparatus further comprises,
a battery unit provided in the layer unit, and for supplying power to the detecting unit and the determining unit.

15. The apparatus of claim 1 further comprises,
a driving unit connected to the base unit, and for rotating the base unit,
wherein the driving unit includes a motor having a rotating shaft connected to the base unit.

16. An apparatus for processing a substrate comprising:
a chemical solution supply unit for supplying a chemical solution;
the chemical solution inspecting apparatus of claim 1 supplied with the chemical solution from the chemical solution supply unit; and
a spin chuck, on which at least one of the chemical solution inspecting apparatus and a wafer is disposed.

17. The apparatus of claim 16, wherein the spin chuck rotates the chemical solution inspecting apparatus so that a velocity of the chemical solution inspecting apparatus increases in the second region unit compared to the first region unit by a rotational force.

18. The apparatus of claim 16, wherein the chemical solution includes any one of a cleaning solution for cleaning the wafer or a processing solution for processing the wafer.

19. The apparatus of claim 18, wherein the chemical solution comprises a cleaning solution,
the apparatus further comprises,
a cup unit surrounding the spin chuck and for accommodating the chemical solution discharged from the wafer or the chemical solution inspecting apparatus.

20. An apparatus for inspecting a chemical solution comprising:
a base unit having an inlet, through which a chemical solution is introduced;
a flow path unit, in which the chemical solution introduced through the inlet is moved while a velocity of its fluid is changed, and including a first region unit provided adjacent to the inlet of the base unit and a second region unit being in series communication with the first region unit, in which the chemical solution discharged from the first region unit is moved;
a detecting unit including a first detecting member for detecting a first signal that is an electrical signal of the first region unit, and a second detecting member for detecting a second signal that is an electrical signal of the second region unit; and
a determining unit for receiving a signal from the detecting unit and determining that a particle and a bubble are detected if a current of the first signal and the second signal is changed compared to a reference value, and discriminating and determining a particle and a bubble according to a difference in a current between the first signal and the second signal or a time difference of current change durations detected by the first detecting member and the second detecting member,
wherein the inlet is provided in a center of the base unit,
wherein the flow path unit is provided radially from a center of the base unit,
wherein the flow path unit includes a first section having a first width and a second section having a second width having a larger width compared to the first width,
wherein each of the first section and the second section is provided at least one in each of the first region unit and the second region unit,
wherein by receiving a rotational force from outside or generating a centrifugal force, a fluid velocity of the chemical solution moving in the second region unit is increased compared to the first region unit,
wherein the detecting unit is electrically connected to the second section.

* * * * *